United States Patent [19]
Satoh

[11] Patent Number: 6,063,203
[45] Date of Patent: *May 16, 2000

[54] SUSCEPTOR FOR PLASMA CVD EQUIPMENT AND PROCESS FOR PRODUCING THE SAME

[75] Inventor: Kiyoshi Satoh, Tokyo, Japan

[73] Assignee: ASM Japan K.K., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/088,867

[22] Filed: Jun. 2, 1998

[30] Foreign Application Priority Data

Jun. 6, 1997 [JP] Japan ................................ 9-163571

[51] Int. Cl.$^7$ ............................................. C23C 16/00
[52] U.S. Cl. ............................................. 118/728; 156/345
[58] Field of Search .................. 118/715, 728; 156/345

[56] References Cited

U.S. PATENT DOCUMENTS

| | | |
|---|---|---|
| 5,350,479 | 9/1994 | Collins et al. . |
| 5,460,684 | 10/1995 | Saeki ...................................... 156/345 |
| 5,531,835 | 7/1996 | Fodor ...................................... 118/728 |
| 5,539,609 | 7/1996 | Collins et al. . |
| 5,581,874 | 12/1996 | Aoki et al. ................................ 29/825 |
| 5,656,093 | 8/1997 | Burkhart ................................ 118/728 |

*Primary Examiner*—Bruce Breneman
*Assistant Examiner*—Erin Fieler
*Attorney, Agent, or Firm*—Knobbe, Martens, Olson & Bear, LLP

[57] ABSTRACT

Provided are a susceptor for a plasma CVD equipment, characterized in that the surface of the susceptor has raised and depressed portions which are continuously formed, and a steep protrusion is completely removed in the raised portion, and a method of roughening a surface of a susceptor for a plasma CVD equipment, which comprises a step of mechanically flattening the surface of the susceptor, a step of shot-blasting the surface of the thus-flattened susceptor, and a step of polishing the shot-blasted surface of the susceptor chemically, electrochemically and/or mechanically, a steep protrusion being completely removed from the surface of the susceptor, and an Ra value of the susceptor surface being $1 \mu m \leq Ra \leq 8 \mu m$. Since the susceptor of the present invention reduces a rate of contact between a wafer substrate and the susceptor surface, adsorption due to charging can be prevented. Since the protrusion is completely removed from the surface of the susceptor, there is no fear of particle contamination due to abrasion. Since the Ra value of the susceptor surface is not changed due to abrasion upon using the susceptor of the present invention, the process stability is improved, and the film-forming treatment can be conducted with a high reproducibility.

8 Claims, 5 Drawing Sheets

SUSCEPTOR FOR PLASMA CVD EQUIPMENT AND PROCESS FOR PRODUCING THE SAME

BACKGROUND OF THE INVENTION

The present invention relates to a susceptor for mounting and holding a wafer substrate in a plasma excitation CVD equipment. More specifically, the present invention relates to a surface structure of the same and a process for producing the same.

A CVD equipment in which a thin film is grown on a wafer substrate in a vacuum container having a vacuum exhaust mechanism using a source gas excited with a RF plasma has been generally used in a procedure of producing a semiconductor and a liquid crystal display. A wafer substrate is mounted on a susceptor constituting one side of a RF electrode, and heated to a predetermined temperature of approximately 400° C. for obtaining a high-quality film grown. A source gas fed to the vacuum container is introduced into a plasma space formed between an upper electrode to which a RF power is supplied and a lower electrode earthed, and is excited actively.

When silicon dioxide ($SiO_2$) is formed on a wafer according to a plasma excitation CVD method, a monosilane ($SiH_4$) gas and a dinitrogen monoxide ($N_2O$) gas are used as a source gas. When silicon nitride (SIN) is formed on a wafer substrate, a monosilane ($SiH_4$) gas, an ammonia ($NH_3$) gas and a nitrogen ($N_2$) gas are used as a source gas.

In the step of forming a film on a wafer substrate, a film is also formed on a position other than a substrate inside a vacuum container, for example, on a surface of a susceptor which is situated outside of the surface of the upper electrode or the periphery of the wafer substrate. There is a problem that the thickness of the undesirous film is gradually increased, and this film is peeled off owing to the change in the temperature of the surface, floats within the reactor, and is then dropped on and adhered to the wafer substrate. In order to prevent this phenomenon, the inside of the reactor is periodically cleaned in the conventional plasma excitation CVD equipment through plasma etching to remove the undesirous film. In the cleaning of the inside of the reactor through plasma etching, a fluorine-containing gas such as $CF_4$, $C_2F_6$ or $NF_3$ is generally used as a source gas. A fluorine-containing active ion seed chemically removes products adhered to an electrode surface, a susceptor surface or an inner wall of a reactor.

A conventional susceptor is generally formed of aluminum or an aluminum alloy, and its surface is machined smoothly up to an average roughness (Ra) of 1 μm or less. The Ra value here refers to an arithmetic mean roughness, and it is an index value of a roughness defined in JIS BO601-1994. The larger the Ra value, the coarser the surface.

Since a luminum is liable to be reacted with fluorine and there is a possibility of by-product contamination, an anodized film for protection from a fluorine plasma is coated on the surface of the susceptor as described in U.S. Pat. No. 5,039,388.

However, this conventional susceptor structure involves the following problems. As indicated by *Solid State Technology*, p. 139, April 1990 by H. P. W. Hey et al., a wafer substrate mounted on a susceptor having an anodized surface is to be placed in an electric field generated in a plasma space, a nd undergoes ion impact therein, with the result that the wafer substrate is charged in the plasma treatment within the reactor and adsorbed on the susceptor. When the wafer substrate is adsorbed on the susceptor after the film-forming, the substrate cannot easily be removed from the susceptor, making it impossible to smoothly practice the subsequent substrate treatment and the cleaning treatment of the inside of the reactor through plasma etching which is conducted after carrying out the substrate.

Therefore, raised and depressed portions are formed on the surface of the conventional susceptor through shot blasting. This processing is conducted to decrease a rate of contact between the susceptor surface and the reverse surface of the wafer substrate and reduce an adsorption force.

However, in this conventional method, a steep protruded tip is formed on a surface of a susceptor. This tip is repeatedly brought into contact with the wafer substrate, and gradually worn out. Solid particles formed therein are one cause of impurity contamination.

The wear of the tip also gives a serious influence on qualities of a thin film formed besides the contamination. When the wear proceeds, the rate of contact between the susceptor and the wafer is increased. Accordingly, heat conduction from the susceptor to the wafer is changed, and the wafer temperature deviates from the set value. When the wafer temperature is higher than the set value, the growth rate of the film is decreased, and a film having a small thickness is formed within a predetermined film-forming period of time. When the wear proceeds and the rate of contact between the susceptor and the wafer is increased, the potential of the wafer substrate approaches that (zero potential) of the earthed state of the susceptor. Consequently, the ion impact from the upper RF electrode is increased, and a hard film having a high compressive stress is formed. Thus, the wear of the steep tip formed on the surface of the susceptor gives a serious influence on process conditions of the film.

SUMMARY OF THE INVENTION

It is an object of the present invention to provide a susceptor on which a substrate is not adsorbed.

Another object of the present invention is to provide a plasma CVD equipment which causes little contamination.

Still another object of the present invention is to provide a susceptor of which the surface is not worn out.

The other object of the present invention is to provide a susceptor that enables stable film-forming treatment without the need of controlling process conditions in the long-term continuous use.

BRIEF DESCRIPTION OF THE DRAWINGS

FIG. 4 is a graphical representation of experimental results on a change in a film thickness according to the number of wafers.

DETAILED DESCRIPTION OF ONE EMBODIMENT

The susceptor of the present invention has the following structure.

The susceptor for the plasma CVD equipment in the present invention is characterized in that the surface of the susceptor has raised and depressed portions which are continuously formed, and a steep protrusion is completely removed in the raised portion.

Further, an Ra value of the susceptor surface is preferably 1 $\mu m \leq Ra \leq 8$ $\mu m$.

Specifically, from 50 to 80% of a wafer holding area of the susceptor is brought into contact with a wafer.

Aluminum or an aluminum alloy can be used as a material of the susceptor.

Further, the surface of the susceptor can be coated with a thin film of aluminum oxide, aluminum nitride or alumite (aluminum anodic oxidation film).

Meanwhile, a method of roughening a surface of a susceptor for a plasma CVD equipment in the present invention comprises a step of mechanically flattening the surface of the susceptor, a step of shot-blasting the surface of the thus-flattened susceptor, and a step of polishing the shot-blasted surface of the susceptor chemically, electrochemically and/or mechanically, a steep protrusion being completely removed from the surface of the susceptor, and an Ra value of the susceptor surface being 1 $\mu m \leq Ra \leq 8$ $\mu m$.

The method further comprises a step of coating the surface of the susceptor with a thin film of aluminum oxide, aluminum nitride or alumite (aluminum anodic oxidation film).

The susceptor in this method can preferably be formed of aluminum or an aluminum alloy.

Figure 1:
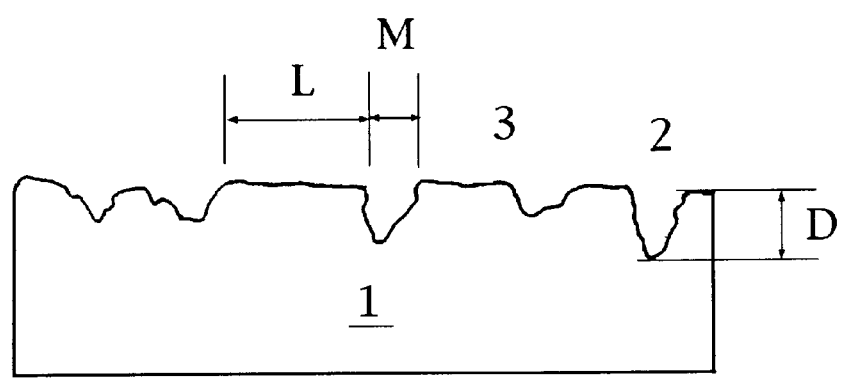
FIG. 1 is an enlarged sectional view of a preferred working example of a susceptor in the present invention.

FIG. 1 is an enlarged sectional view of a surface of a preferable susceptor in the present invention. The surface of the susceptor 1 in the present invention has a depressed portion 2 and a raised portion 3 with a flat tip which are continuously formed. As is shown in the drawing, the raised portion 3 on the surface of the susceptor 1 in the present invention has no steep protrusion. A width L of the raised portion 3 is between 50 and 200 $\mu m$, and a width M of the depressed portion 2 is between 50 and 100 $\mu m$. A depth D of the depressed portion 2 is on the average 80 $\mu m$. The raised portion 3 occupies from 50 to 80%, preferably 60% of the overall surface of the susceptor. Consequently, when the wafer substrate is mounted on the susceptor, from 50 to 80% of the wafer holding area of the susceptor is brought into contact with the reverse surface of the wafer substrate. The Ra value of the susceptor surface in the present invention is controlled to between 1 and 8 $\mu m$, preferably to between 2 and 7 $\mu m$. Aluminum or an aluminum alloy is preferably used as a material of the susceptor. Nickel or aluminum nitride is also available. A thin film of aluminum oxide or aluminum nitride is preferably coated on the surface of the susceptor. When the susceptor is formed of aluminum or an aluminum alloy, a thin film of alumite (aluminum anodic oxidation film) may be coated thereon. The thickness of the thin film coated on the surface of the susceptor is between 5 and 100 $\mu m$. Especially, the thickness of the alumite (aluminum anodic oxidation film) thin film is between 10 and 30 $\mu m$.

Figure 2A:
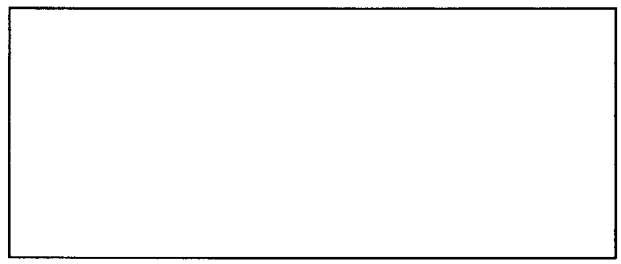
FIG. 2A–C are crossectional views showing the method of the production of a susceptor according to the present invention.
Figure 2B:
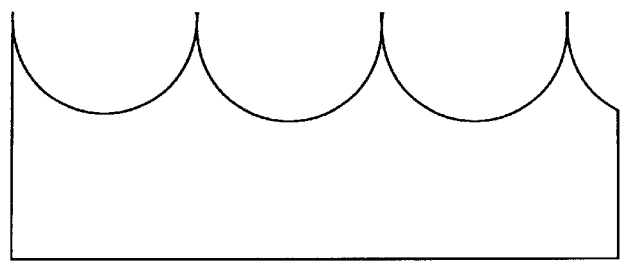
Figure 2C:
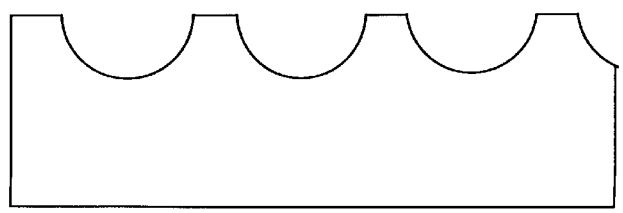

A method of roughening the surface of the susceptor in the present invention is described below. The method of roughening the surface of the susceptor in the present invention comprises a step of mechanically flattening the surface of the susceptor, a step of shot-blasting the surface of the thus-flattened susceptor, and a step of polishing the shot-blasted surface of the susceptor chemically. First, in the mechanical flattening step, the susceptor is flattened with a lathe [refer to FIG. 2A]. Then, in the shot-blasting step, the surface of the susceptor is roughened to an Ra value of 5 $\mu m$ by blowing an abrasive at 3 atm [refer to FIG. 2B]. Finally, in the chemical polishing step, the susceptor is dipped in a 8% sodium hydroxide aqueous solution at 60° C. for 8 minutes to selectively remove a protrusion [refer to FIG. 2C]. In this case, a mixed solution of sodium hydroxide and sodium phosphate may be used instead of a sodium hydroxide aqueous solution. Further, electrolytic polishing in a phosphoric acid solution or polishing with a buff can be conducted instead of the chemical polishing.

The method of the present invention further comprises a step of coating the surface of the susceptor with a thin film of aluminum oxide or aluminum nitride, or with a thin film of alumite (aluminum anodic oxidation film) in the case of the susceptor formed of aluminum or an aluminum alloy. The coating with the alumite (aluminum anodic oxidation film) thin film can be conducted by a usual method such as a sulfuric acid method or the like.

The susceptor of the present invention decreases the rate of contact between the wafer substrate and the susceptor surface, making it possible to prevent adsorption due to charging and to conduct more rapid processing and cleaning of the inside of the reactor.

Since the susceptor of the present invention completely removes the protrusion on the surface of the susceptor, there is no fear of particle contamination due to abrasion, and the productivity is improved.

Since the Ra value of the susceptor surface is not changed due to abrasion upon using the susceptor of the present invention, the process stability is improved, and the film-forming treatment can be conducted with a high reproducibility.

EXAMPLES

Experiments were conducted for comparing the properties of films which are formed upon using the susceptor of the present invention and the conventional susceptor.

Contents of the experiments:

The experiments were conducted by adjusting the Ra value of the susceptor (formed of an aluminum alloy A 5052) in the present invention to approximately 4.0 $\mu m$ and that of the conventional susceptor to approximately 5.0 $\mu m$. The conventional susceptor was obtained by only conducting the roughening upon spraying an emery #60 abrasive at 3 atm. The Ra value was measured using a Surfcom 570A supplied by K. K. Tokyo Seimitsu. A total of 5 positions, namely, a center of the susceptor and four positions spaced apart by 50 mm in a crosswise direction from the center were scanned. The values obtained were arithmetically averaged.

Figure 3:
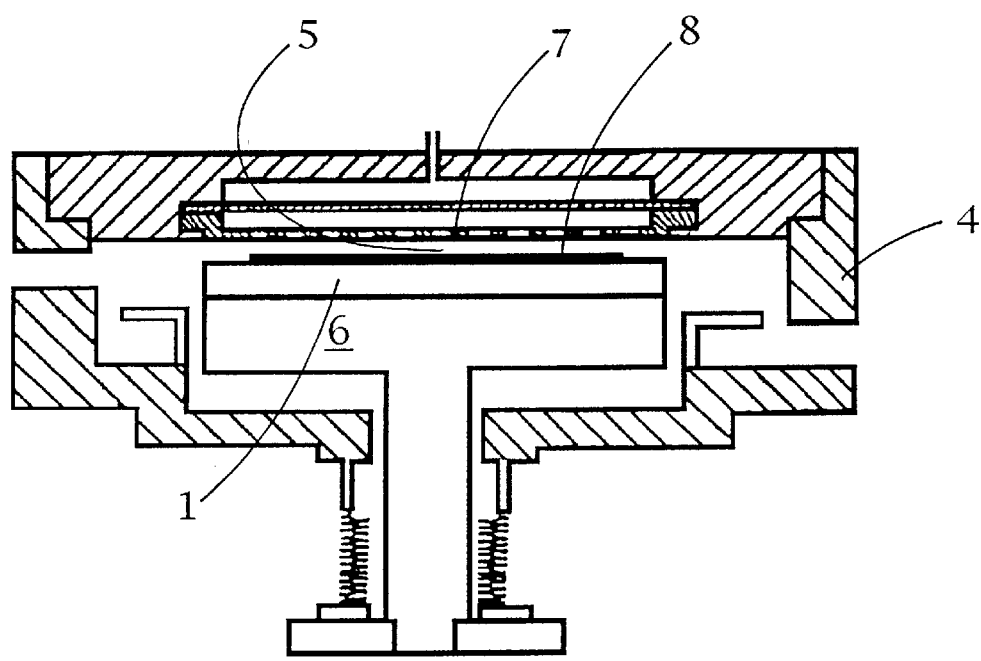
FIG. 3 is a simplified view of a plasma CVD equipment used in evaluation experiments of the susceptor in the present invention.

FIG. 3 is a simplified view of a plasma CVD equipment used in the experiments. A mixed gas of tetraethyl orthosilicate [$Si(OC_2H_5)_4$: TEOS] and an oxygen gas as a source gas was introduced from an upper shower head 7 of a wafer 8 mounted on a susceptor 1 to a plasma reaction region 5 of a reaction chamber 4 vacuum-exhausted. The susceptor 1 and the wafer substrate 8 were heated to a predetermined temperature of 360° C. with a heater 6. The pressure in the inside of the reaction chamber 4 was reduced to 3 torr, and this reduced pressure was maintained. A combination of two types of RF powers (285 W to 13.56 MHz and 225 W to 430 KHz) different in the frequency was applied to the shower head 7 to generate plasma within the reaction region 5, whereby silicon dioxide of approximately 500 nm could be grown on the wafer substrate in 47 seconds. This procedure was repeated with respect to 500 wafers. The film thickness of silicon dioxide and the compressive stress were measured. The results were plotted in FIGS. 4 and 5. The inside of the reaction chamber 4 used was cleaned through dry-etching whenever one wafer was treated.

Figure 4A:
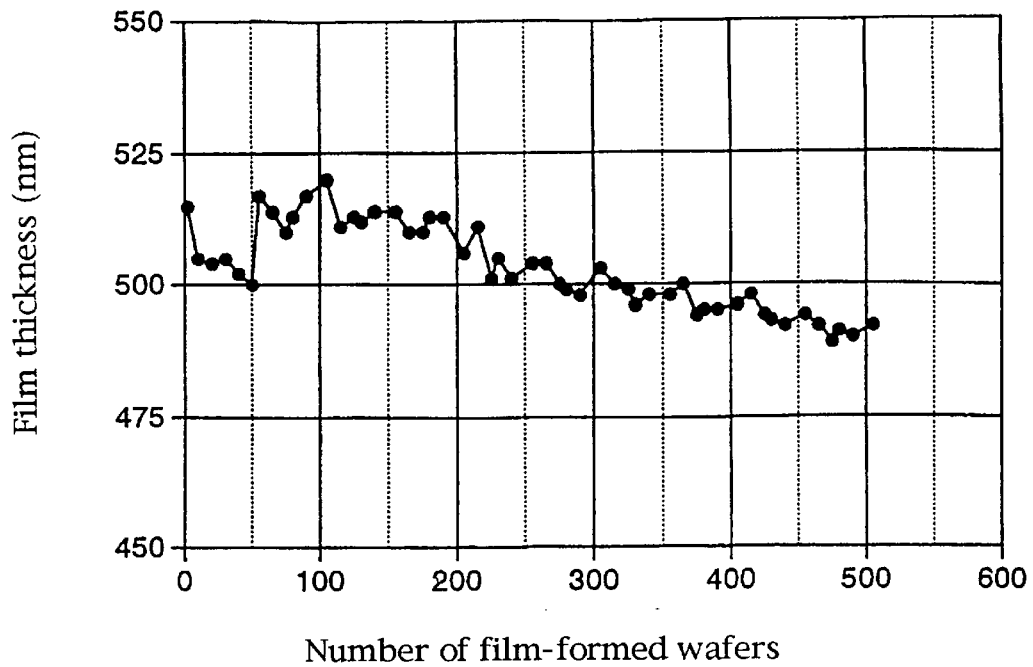
FIG. 4A shows the experimental results obtained by using a conventional susceptor.
Figure 4B:
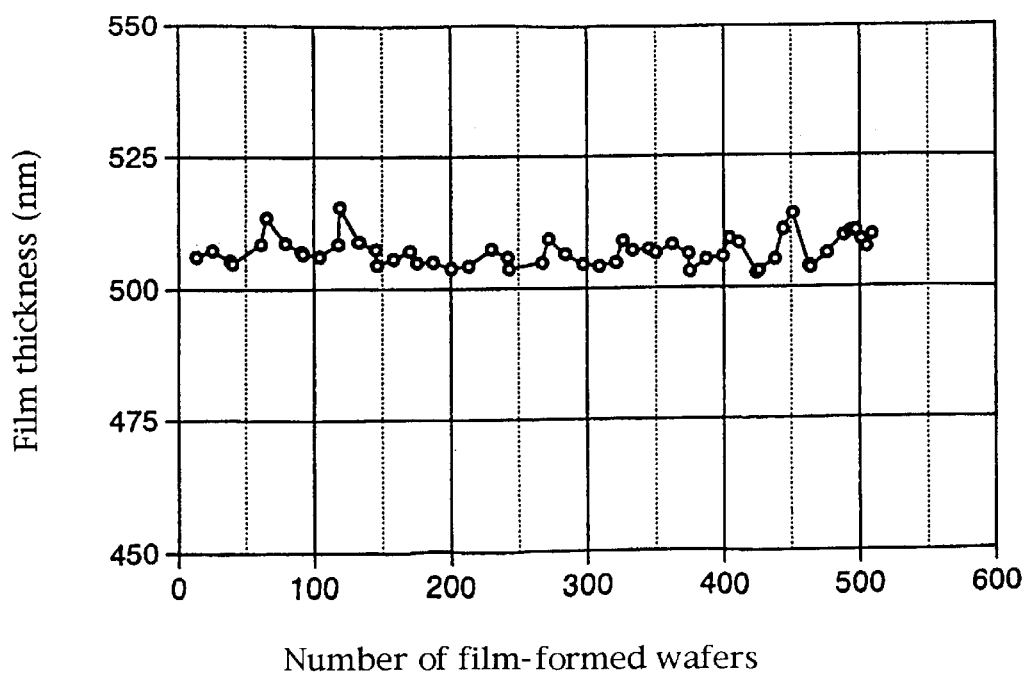
FIG. 4B shows those obtained by using the susceptor of the present invention.

Experimental results:

FIGS. 4A and 4B are graphical representations showing the change in the film thickness given when using the conventional susceptor and the susceptor of the present invention. With respect to FIG. 4A, it is found in the conventional susceptor that as the number of treated wafers is increased, the thickness of the film is gradually decreased. This is because the protrusion on the surface of the susceptor is worn out through repeated contact between the susceptor and the wafer to increase the area of contact between the susceptor and the wafer, with the result that the heat conduction from the susceptor to the wafer is increased to raise the wafer temperature and thereby decrease the film growth rate. Meanwhile, with respect to FIG. 4B, it is found in the susceptor of the present invention that the thickness of the film remains almost unchanged even with the increase in the number of treated wafers.

Figure 5A:
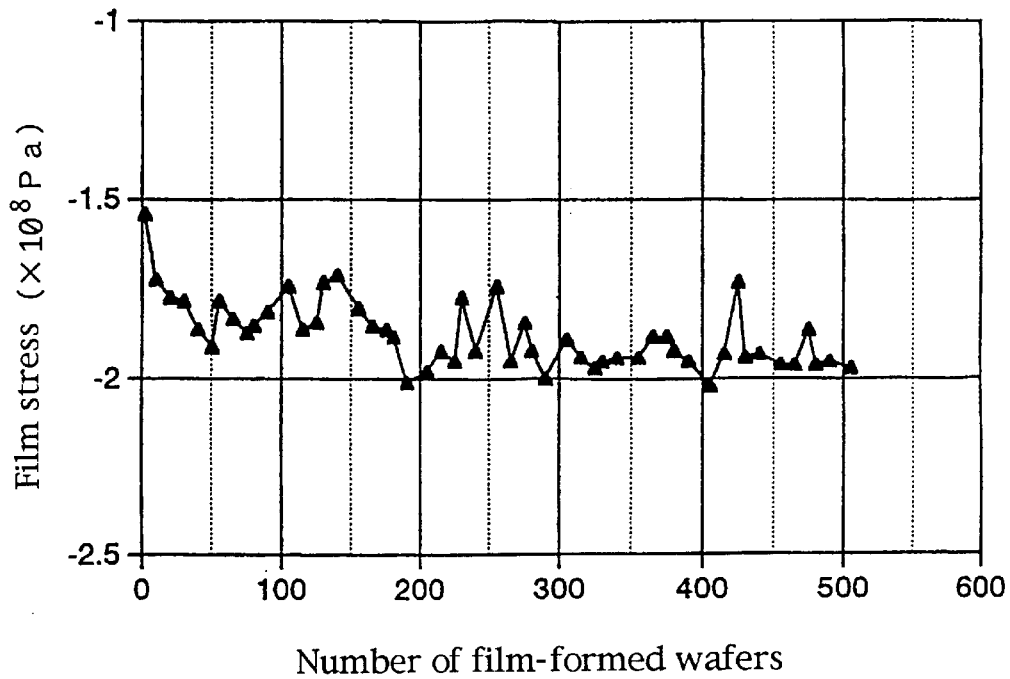
FIG. 5A and 5B are graphical representations of experimental results on a change in a film compressive stress according to the number of wafers.
Figure 5B:
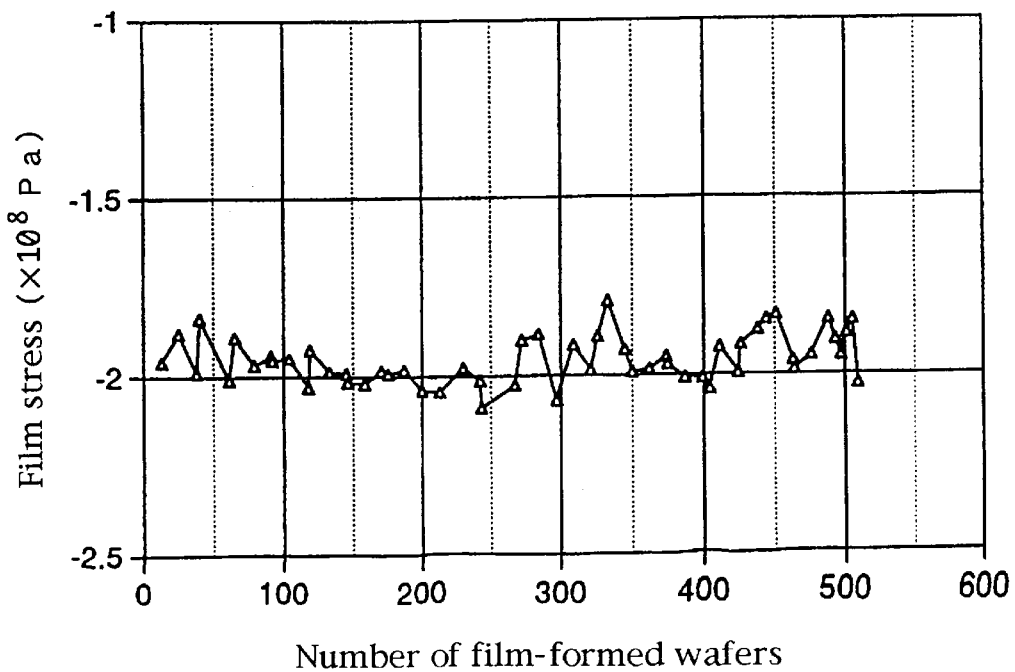

FIGS. 5A and 5B are graphical representations showing the change in the compressive stress given when using the conventional susceptor and the susceptor of the present invention. With respect to FIG. 5A, it is found in the conventional susceptor that the compressive stress is gradually increased with the increase in the number of treated wafers. This is because the protrusion on the surface of the susceptor is worn out by the repeated contact between the susceptor and the wafer to decrease the potential difference between the susceptor and the wafer, with the result that the potential difference between the applied electrode and the wafer is relatively increased to increase the ion bombardment (the potential difference between the RF applied electrode and the earthed electrode (susceptor) is constant). Meanwhile, with respect to FIG. 5B, it is found in the susceptor of the present invention that the compressive stress remains almost unchanged even with the increase in the number of treated wafers.

Consequently, it was concluded that the susceptor of the present invention was higher in the process stability and the reproducibility than the conventional susceptor.

The present invention includes the following aspects:

1) A susceptor, suitably installed in a plasma CVD equipment, characterized in that the susceptor has a raised and recessed surface for mounting and holding a wafer substrate thereon, and sharp peaks of the raised portions are completely removed from the raised portions.

2) The susceptor of item 1, wherein an Ra value of the susceptor surface is 1 $\mu$m$\leq$Ra$\leq$8 $\mu$m.

3) The susceptor of item 1, wherein 50% to 80% of a wafer holding area of the susceptor is in physical contact with a wafer surface.

4) The susceptor of any one of items 1 to 3, which is formed of aluminum or an aluminum alloy.

5) The susceptor of any one of items 1 to 4, which is further covered with a thin film of aluminum oxide, aluminum nitride or alumite (aluminum anodic oxidation film).

6) A method of roughening a surface of a susceptor suitably installed in a plasma CVD equipment, comprising the steps of: mechanically flattening the surface of a susceptor; shot-blasting the thus-flattened surface of the susceptor; and polishing the shot-blasted surface of the susceptor chemically, electrochemically, and/or mechanically, wherein steep protrusions are completely removed from the surface of the susceptor, and an Ra value of the susceptor surface is 1 $\mu$m$\leq$Ra$\leq$8 $\mu$m.

7) The method of item 6, which further comprises the step of covering the surface of the susceptor with a thin film of aluminum oxide, aluminum nitride or alumite (aluminum anodic oxidation film).

8) The method of items 6 or 7, wherein the susceptor is formed of aluminum or an aluminum alloy.

While the invention has been described in detail and with reference to specific embodiments thereof, it will be apparent to one skilled in the art various changes and modifications can be made therein without departing from the spirit and scope thereof.

What is claimed is:

1. A susceptor serving as an electrode and having a surface for mounting and holding a wafer substrate thereon during plasma treatment of the wafer substrate, said surface comprising peaks and valleys with an average roughness in the range of 2–7 $\mu$m, wherein said peaks are flattened until a wafer-holding area for substantially contacting the wafer substrate in the surface area is 50% to 80% of the surface area, wherein the flattened peaks are not subject to frictional wear due to the wafer substrate, and the wafer substrate does not adhere to the surface of the susceptor during plasma treatment.

2. The susceptor according to claim 1, wherein said surface is made of aluminum or an aluminum alloy.

3. A susceptor according to claim 1, wherein said surface is covered with a thin film of alumite having a thickness of 10–30 $\mu$m.

4. A method of roughening a surface of a susceptor for mounting and holding a wafer substrate thereon during plasma treatment of the wafer substrate, comprising the steps of: mechanically flattening a surface of a susceptor, shot-blasting the flattened surface to form peak and valleys thereon; and polishing the shot-blasted surface chemically, electrochemically, and/or mechanically to reduce the peaks until the average roughness of the surface is in the range of 2–7 $\mu$m, and a wafer-holding area for substantially contacting the wafer substrate in the surface area is 50% to 80% of the surface area.

5. The method according to claim 4, further comprising the step of coating the polished surface with alumite at a thickness of 10–30 $\mu$m.

6. The method according to claim 4, wherein said surface is made of aluminum or an aluminum alloy.

7. A susceptor serving as an electrode and having a surface for mounting and holding a wafer substrate thereon during plasma treatment of the wafer substrate, said surface comprising peaks and valleys with an average roughness in the range of 2–8 $\mu$m, wherein said peaks are flattened until a wafer-holding area for substantially contacting the wafer substrate in the surface area is 50% to 80% of the surface area, wherein the flattened peaks are not subject to frictional wear due to the wafer substrate, and the wafer substrate does not adhere to the surface of the susceptor during plasma treatment.

8. A method of roughening a surface of a susceptor for mounting and holding a wafer substrate thereon during plasma treatment of the wafer substrate, comprising the steps of: mechanically flattening a surface of a susceptor, shot-blasting the flattened surface to form peak and valleys thereon; and polishing the shot-blasted surface chemically, electrochemically, and/or mechanically to reduce the peaks until the average roughness of the surface is in the range of 2–8 $\mu$m, and a wafer-holding area for substantially contacting the wafer substrate in the surface area is 50% to 80% of the surface area.

* * * * *